United States Patent [19]
Droege et al.

[11] Patent Number: 5,796,335
[45] Date of Patent: Aug. 18, 1998

[54] SECURITY FOIL WITH SHIELDING FROM ELECTROMAGNETIC RADIATION

[75] Inventors: Hartmut Droege, Stuttgart; Ludwig Fischer, Herrenberg; Markus Scheibel, Blaufelden; Dieter Sonnentag, Schoenuich, all of Germany

[73] Assignee: International Business Machines Corporation, Armonk, N.Y.

[21] Appl. No.: 782,475

[22] Filed: Jan. 10, 1997

[30] Foreign Application Priority Data

Jan. 11, 1996 [DE] Germany ............... 196 00 770.4

[51] Int. Cl.⁶ .................................................. G08B 13/00
[52] U.S. Cl. .................. 340/550; 109/78; 250/515.1; 380/3
[58] Field of Search ............... 340/550, 825.31, 340/825.32; 380/3, 52; 250/515.1, 505.1; 109/78, 80, 85; 428/332, 401, 911, 916, 457; 427/160; 361/749–751

[56] References Cited

U.S. PATENT DOCUMENTS

| | | | |
|---|---|---|---|
| 3,594,770 | 7/1971 | Ham et al. | 340/550 |
| 4,662,288 | 5/1987 | Hastings et al. | 109/85 X |
| 4,691,350 | 9/1987 | Kleijne et al. | 380/3 |
| 4,833,334 | 5/1989 | Valy et al. | 250/515.1 |
| 5,027,397 | 6/1991 | Double et al. | 380/3 |
| 5,236,101 | 8/1993 | Dugmore | 250/515.1 X |
| 5,289,785 | 3/1994 | MacPherson et al. | 340/550 X |
| 5,353,350 | 10/1994 | Unsworth et al. | 380/3 |
| 5,519,168 | 5/1996 | Owens | 250/515.1 X |

FOREIGN PATENT DOCUMENTS 2245738  1/1992  United Kingdom ........... 340/550

*Primary Examiner*—Thomas J. Mullen, Jr.
*Attorney, Agent, or Firm*—Norman L. Gundel

[57] ABSTRACT

The invention discloses a security foil which covers a security module, wherein the security foil comprises a shielding from electromagnetic radiation from inside and outside. In a preferred embodiment the security foil comprises a metal lattice with defined lattice distances. The lattice distances can be used to change characteristics of the shielding from electromagnetic radiation, in particular the relevant spectra. The invention is especially applicable in electronic payment transactions. The invention permits effective and low-cost shielding of security modules against electromagnetic radiation from inside and outside. Additional time and labor is saved because existing components can be used.

7 Claims, 2 Drawing Sheets

......... =Rebated edge

········· = Rebated edge

210 Intrusion Detection Screen with Meander

Ground Potential

SECURITY FOIL WITH SHIELDING FROM ELECTROMAGNETIC RADIATION

BACKGROUND OF THE INVENTION

1. Field of the Invention

The present invention relates to a security foil for electronic detection of mechanical penetration of a security module which is covered by said security foil, wherein said security module comprises parts that are relevant to security; also to a security module of such a type.

2. Description of the Related Art

Equipment with high security requirements, in particular for electronic payment transactions (electronic funds transfer or electronic cash), often have a so-called security module in which components which need to be protected against unauthorized access are installed.

Inside, or in conjunction with, the security module there is frequently a keyboard for input of data, such as a Personal Identification Number (PIN). Electromagnetic radiation occurs when the keyboard is operated, and when other operations are carried out within the security module. Measuring the amount of electromagnetic radiation emitted can, in turn, provide information on data, such as the keys pressed to input the PIN number during identification, or relating to other operations. However, since such data are sensitive and in many cases secret, measurement of the emitted electromagnetic radiation must be prevented.

The security module must furthermore be protected against unhindered penetration by electromagnetic waves. In certain applications, on the basis of certification regulations, the electromagnetic compatibility (EMC) of the overall unit, including the security module, must also be ensured. For this reason, shielding of the security module is frequently suggested.

Metallic shielding is generally used to prevent electromagnetic waves penetrating into and being emitted from electronic equipment. In many cases, in particular, the security module is located inside a metal housing. The metal housing generally provides the security module with effective protection against electromagnetic radiation from inside and outside. However, metal housings are often time-consuming, and thus expensive, to manufacture. As a result, plastic housings are often used. In this case the inside of the housing is subjected to an additional manufacturing stage, being coated with a conductive lacquer or other coverings. This, too, can provide effective shielding against electromagnetic radiation.

The known means of shielding security modules against electromagnetic radiation from inside and outside do for the most part provide adequate shielding, but require additional labor and material expenditure, and so make the overall product correspondingly more expensive.

SUMMARY OF THE INVENTION

The object of the invention is to provide effective shielding of security modules against electromagnetic radiation from inside and outside, in the most cost-effective way possible.

In accordance with the invention, a security foil such as an intrusion detection screen, placed around a security module, is directly provided with shielding against electromagnetic radiation from inside and outside. The shielding is preferentially a metal lattice with defined lattice distances which is attached to the foil. The size of the lattice distances can be used to influence the characteristics of the radiation, in particular the relevant spectra.

The invention is especially applicable in electronic payment transactions.

The invention permits effective and low-cost shielding of security modules against electromagnetic radiation from inside and outside. Additional time and labor is saved because existing components can be used.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative detailed embodiment and when read in conjunction with the accompanying drawings, wherein:

While the invention will be described in connection with a preferred embodiment, the description is not intended to limit the invention to that embodiment. On the contrary, the invention is intended to cover all alternatives, modifications and equivalents as may be included within the spirit and scope of the invention as described by the appended claims.

DETAILED DESCRIPTION OF THE INVENTION

Figure 1:
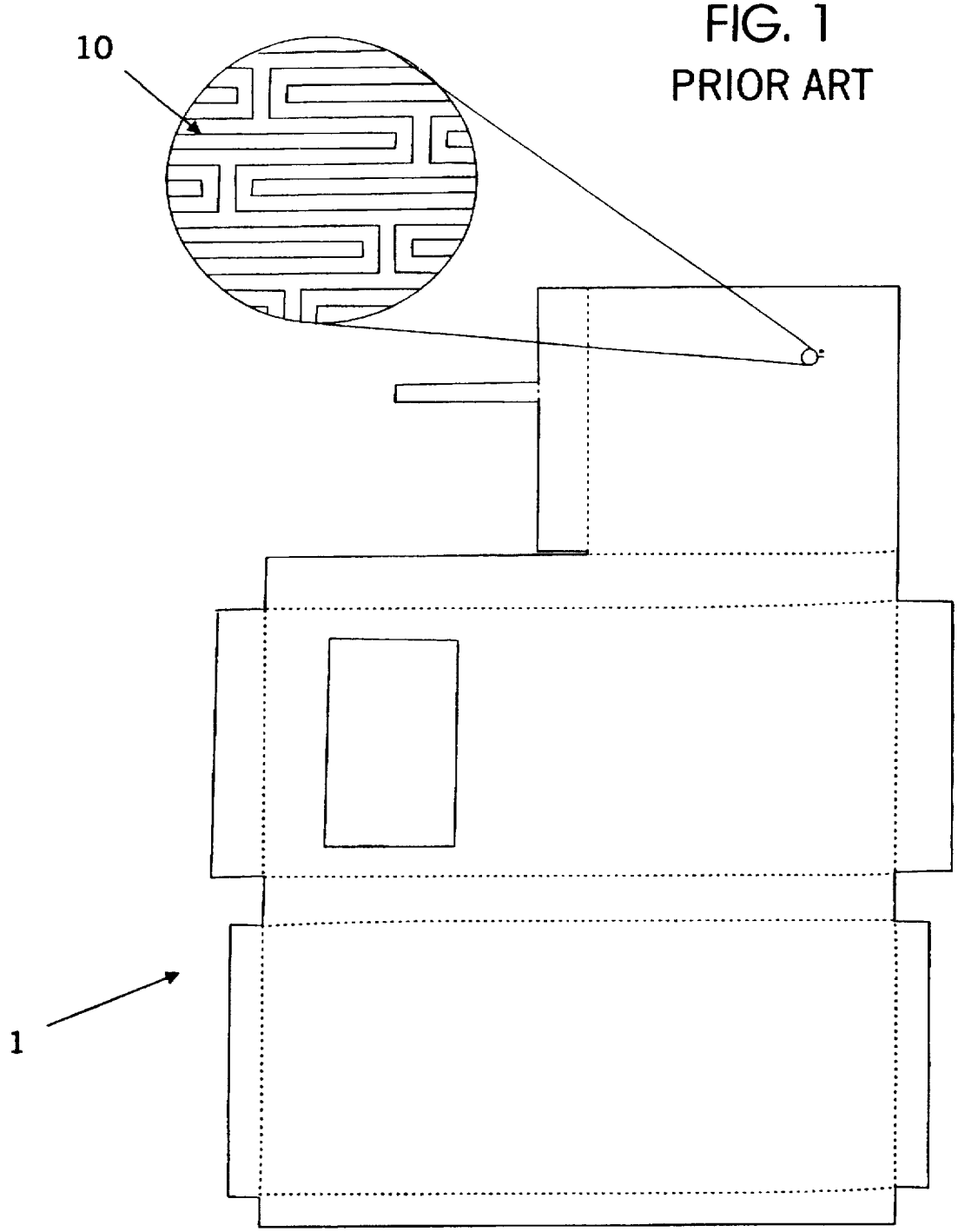
FIG. 1 shows a known intrusion detection screen with meandering conductors.

With reference now to the Figures, and in particular with reference to FIG. 1, there is shown an intrusion detection screen 1. To prevent unauthorized access to components and stored data inside a security module, not shown, the security module is completely enclosed in a security foil, such as the intrusion detection screen 1. The intrusion detection screen 1 is preferentially executed as a flexible circuit board, and preferentially has meandering conductors 10 of minimal width and with minimal spacing between them; these represent the actual intrusion screening. FIG. 1 shows an exploded view of an area of the conductors 10. If the conductors are shorted or impaired by mechanical impact such as drilling or cracking, an alarm is triggered by a security circuit (not shown) connected to the conductors 10. The triggering of the alarm preferentially causes all security-sensitive data to be deleted.

Figure 2:
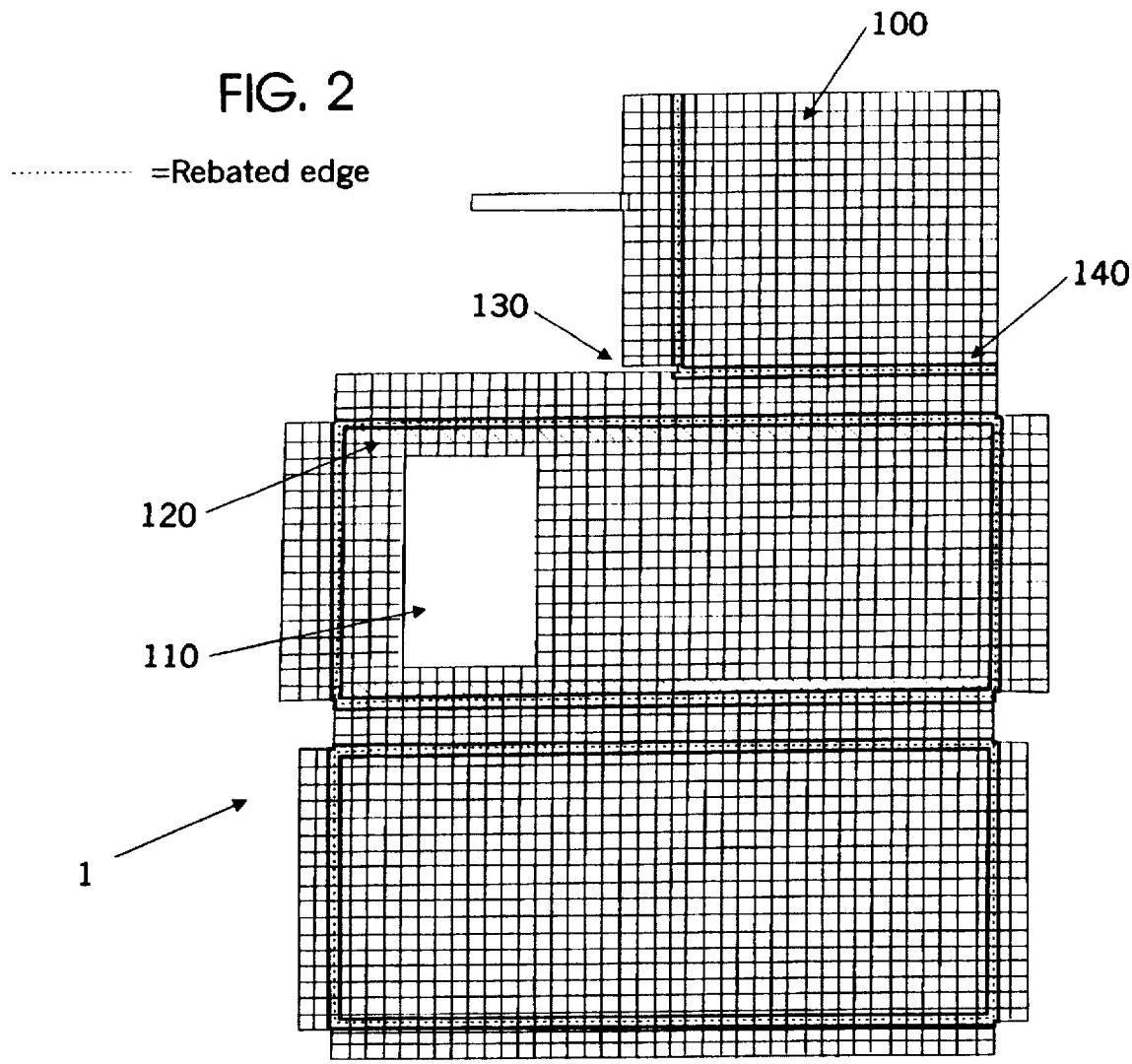
FIG. 2 shows a preferred embodiment of the shielding of the present invention on the intrusion detection screen in accordance with FIG. 1.

As shown in FIG. 2, in accordance with the invention, the intrusion detection screen 1 is provided directly with shielding against electromagnetic radiation from inside and outside. The shielding is preferentially a metal lattice with defined lattice distances which is attached to the intrusion detection screen 1. The size of the lattice distances can be used to influence the characteristics of the radiation, in particular the relevant spectra. No other components are usually required for electromagnetic shielding.

FIG. 2 shows a preferred embodiment of the shielding on the intrusion detection screen 1 in accordance with FIG. 1. The shielding comprises individual, electrically interconnected wires 100, preferentially copper wires. The copper wires 100 are preferentially executed as a lattice with defined distances, as shown in FIG. 2. However, a different lattice pattern can be used, or the shielding can be executed as a continuous, complete covering of more or less the entire surface of the intrusion detection screen 1.

In construction of the shielding, recesses 110 can be used to allow for design features such as access to a keyboard or a display. If shielding is not required in certain areas, or if shielding must be omitted in certain areas for design reasons, this can be taken into account at the shielding planning and layout stage. The recesses 110 preferentially have a conductor running around their rim, but there are no conductors within the recess 110.

Moreover, special areas of the shielding can be provided for contacts 120 with the said shielding. The contacts 120 are preferentially executed such that they permit secure electrical connection of the shielding over a wide area, for example with a potential to ground. The wires in the area of the contacts 120 are preferentially wider, in order to achieve low-resistance contacting.

Where the security module is installed in an overall unit, the shielding can be connected to a frame terminal of the unit without additional adaptation. For example, the shielding module can be attached with the aid of a metal cover plate. This cover plate is then conductively connected to the frame terminal of the unit.

To prevent oxidation of the shielding, the complete lattice can be galvanically protected, for example by means of tin-plating.

The intrusion detection screen 1 is preferentially executed as a two-sided flexible circuit board. The meanders for intrusion detection are affixed to one side, while the shielding is located on the other side of the intrusion detection screen 1.

Figure 3:
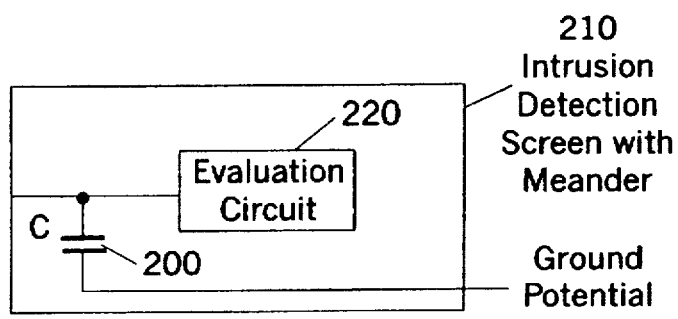
FIG. 3 shows a wiring scheme for an embodiment in which the meander structure for intrusion detection is used directly for electromagnetic shielding.

In another embodiment, the meander structure for intrusion detection is used directly for electromagnetic shielding. FIG. 3 shows the wiring for an arrangement of this kind. The meander 210 of the intrusion detection screen 1 is connected to the ground potential via a capacitor 200. As a result, all electromagnetic signals occurring inside the security module or acting on the module from outside are connected to the ground potential and thus rendered ineffective. An evaluation circuit 220, which reacts only to manipulations of the meander 210 such as a break, is unaffected by this measure. The ground potential can preferentially be introduced into the intrusion detection screen 1 from the outside, so that the ground potential is inside the intrusion detection screen 1.

Outer edges 130 of the shielding are preferentially adjusted to the outer edge of the intrusion detection screen 1. Tearing of the intrusion detection screen 1 during assembly can be prevented in this way.

Bending edges 140 are preferentially pre-defined with wires of the shield. This facilitates bending of the intrusion detection screen 1 during assembly.

Where a keyboard is used inside the security module, it may have keying points underneath the intrusion detection screen 1. These points are preferentially released away from the shielding by means of the recess 110, so that the required press forces do not become impermissibly high.

While the invention has been particularly shown and described with reference to a preferred embodiment, it will be understood that various changes in form and detail may be made therein without departing from the spirit and scope of the invention.

What is claimed is:

1. A security foil for electronic detection of mechanical penetration and for electromagnetic radiation shielding of a security module which is covered by said security foil, said security foil comprising:

a flexible circuit board intrusion detection screen for covering the security module;

a metal lattice of wires with defined distances between the wires of the lattice, attached to the intrusion detection screen.

2. A security foil in accordance with claim 1, wherein the intrusion detection screen has a recess to allow for access to the security module.

3. A security foil in accordance with claim 1, wherein the metal lattice further includes electrical contacts which permit secure electrical connection of the metal lattice over a wide area.

4. A security foil in accordance with claim 1, wherein the metal lattice is galvanically protected.

5. A security foil in accordance with claim 4, wherein the metal lattice is galvanically protected by tin-plating.

6. A security foil in accordance with claim 1, wherein the security foil is executed as a two-sided flexible circuit board, wherein one side is used for intrusion detection and the metal lattice is located on the other side.

7. A security foil in accordance with claim 1, wherein outer edges of the metal lattice are recessed from the outer edge of the intrusion detection screen.

* * * * *